(12) United States Patent
Liu et al.

(10) Patent No.: US 7,687,601 B2
(45) Date of Patent: Mar. 30, 2010

(54) METHODS FOR PURIFYING POLYMERS USING SOLID SCAVENGERS

(75) Inventors: Changkun Liu, Lawrenceville, NJ (US); Bing Zhou, Cranbury, NJ (US)

(73) Assignee: Headwaters Technology Innovation, LLC, Lawrenceville, NJ (US)

( * ) Notice: Subject to any disclaimer, the term of this patent is extended or adjusted under 35 U.S.C. 154(b) by 694 days.

(21) Appl. No.: 11/538,339

(22) Filed: Oct. 3, 2006

(65) Prior Publication Data

US 2008/0081877 A1 Apr. 3, 2008

(51) Int. Cl.
*C08F 8/00* (2006.01)
*C08F 6/02* (2006.01)
*C08C 2/04* (2006.01)

(52) U.S. Cl. .............. 528/482; 525/333.3; 525/333.5; 525/333.6; 525/343; 525/351; 525/416; 525/417; 525/535; 525/540; 525/374; 528/490; 528/495; 528/496; 528/499; 528/487

(58) Field of Classification Search ............... 525/338, 525/339, 333.3, 333.5, 333.6, 343, 351, 374, 525/417, 416, 535, 540; 528/490, 495, 496, 528/499, 487, 482

See application file for complete search history.

(56) References Cited

U.S. PATENT DOCUMENTS

| | | | | |
|---|---|---|---|---|
| 4,985,540 A | * | 1/1991 | Bradford et al. ........... 528/482 |
| 5,777,070 A | | 7/1998 | Inbasekaran et al. ....... 528/394 |
| 5,919,930 A | | 7/1999 | Haber et al. | |
| 6,376,690 B1 | | 4/2002 | Grubbs et al. | |
| 6,740,684 B2 | * | 5/2004 | Paliuras et al. ............... 521/31 |
| 6,894,145 B2 | | 5/2005 | Xiao et al. ................ 528/490 |
| 2004/0241496 A1 | | 12/2004 | Zheng et al. | |
| 2004/0254336 A1 | | 12/2004 | Xiao et al. | |
| 2005/0263758 A1 | | 12/2005 | Treacher et al. | |
| 2006/0037912 A1 | | 2/2006 | Wertsching et al. | |

FOREIGN PATENT DOCUMENTS

WO    WO 2004/113420    12/2004

OTHER PUBLICATIONS

Roy, P. K. et al Talanta vol. 59, pp. 239-246 published Feb. 2003.*
Chen, et al., Regiocontrolled Synthesis of Poly(3-alkylthiophenes) Mediated by Rieke Zinc: Their Characterization and Solid-State Properties, American Chemical Society, 1995.

* cited by examiner

*Primary Examiner*—Irina S Zemel
*Assistant Examiner*—Jeffrey Lenihan
(74) *Attorney, Agent, or Firm*—Workman Nydegger

(57) ABSTRACT

Conductive polymers are purified using a solid scavenger. The solid scavengers include metal-scavenging functional groups linked to the surface of a particle support material. To improve the functionalization of the support material, the support materials are first treated with sulfuric acid or nitric acid before attaching the molecules containing the metal-scavenging functional groups. The solid scavengers used in the purification methods are more efficient at removing impurities in conductive polymers than existing scavengers.

16 Claims, No Drawings

METHODS FOR PURIFYING POLYMERS USING SOLID SCAVENGERS

BACKGROUND OF THE INVENTION

1. The Field of the Invention

The present invention relates to methods for purifying electrically conductive polymers. More particularly, the present invention relates to methods for purifying conductive polymers using a solid scavenger.

2. The Relevant Technology

Conductive polymers possess conjugated π-electron systems along their backbone, thereby giving them the ability to support positive and negative charge carries with controllable mobility along the chains. In addition to the metallic and semiconductor characteristics, conductive polymers also exhibit unique electroluminescence properties. These features of conductive polymers have generated strong interest from academia and industry researchers. However, the use of conductive polymers in commercial products has been rather limited so far.

One reason for the lack of commercialization of conductive polymers is due to the difficulty of adequately purifying the polymers. Even small amounts of impurities in the polymers may act as charge trappers or photo quenchers, and alter the polymer's semiconductor characteristics.

In light emitting devices fabricated from conductive polymers, metallic impurities can act as recombination centers for injected charge carries, which leads to an increase in recombination rates. The increased recombination rates often degrade the light emitting efficiency and increase the current leakage of the devices. Another problem with contamination is variable semiconducting properties. Doping concentrations in semiconductors are controlled to achieve desired semiconductor properties. If the metal content in a given electronic polymer system is not controllable, its semi-conductive behavior will not be predictable.

Despite the need to limit metal impurities, most polymer synthesis techniques use relatively large amounts of transition metal catalysts. The use of a catalyst in polymer synthesis is required to obtain reasonable reaction rates for commercial production of polymer.

Recently attempts have been made to purify conductive polymers using metal scavengers. The metal scavengers bind to the metal impurities and can then be separated from the polymer using filtration. While this technique appears to be promising, its implementation has been difficult. One problem with the scavenger technique has been low yields. The amount of impurity removed for a given amount of scavenger is low, which means that excess scavenger must be used to achieve desired results.

Another problem with some existing scavengers is the cost of manufacturing the scavengers. The metal scavengers are typically inorganic particles such as silica that are functionalized with a silane. Silanes are relatively expensive for use as scavengers. The costs associated with silanes contribute to the expenses that make commercial production of conductive polymers less feasible.

Finally despite recent improvements in polymer purification techniques, there is still a need for further improvements in purification. Additional purity is needed to expand the life of the polymers and enable their use in a wider variety of applications.

BRIEF SUMMARY OF THE INVENTION

The present invention is directed to a method of purifying polymers using solid scavengers. The solid scavengers include metal-scavenging functional groups linked to the surface of a particle support material. To improve the functionalization of the support material, the support materials are first treated with sulfuric acid or nitric acid before attaching the molecules containing the metal-scavenging functional groups. The solid scavengers used in the purification methods of the present invention are more efficient at removing impurities in conductive polymers than existing scavengers. The improved efficiency of the scavengers of the present invention results in a more pure polymer and/or reduces the cost of purifying a given amount of metal-contaminated polymer.

The method for purifying conductive polymers according to the present invention generally includes (i) dissolving the polymer in a solvent, (ii) mixing the acid treated and functionalized solid scavenger with the polymer mixture and allowing the functional groups of the solid scavenger to bond with metal impurities, (iii) separating the solid scavenger from the mixture, and (iv) removing the solvent from the polymer.

In an exemplary embodiment, the solid scavenger is separated from the mixture using filtration. If desired, the metals can be recovered from the filtrate. The solid support material can also be recovered and reused to manufacture the solid scavengers.

In an exemplary embodiment, the methods of the present invention also include the step of manufacturing the solid scavenger. The solid scavenger can be manufactured by treating a particulate support material with sulfuric acid or nitric acid. The sulfonated or nitrated support material is thereafter reacted with an organic agent that can bond to acid functional groups and includes one or more metal-scavenging functional groups.

In an exemplary embodiment, the support material is a particulate organic polymer. Surprisingly, it has been found that purification efficiencies of conductive polymers can be dramatically improved by using solid scavengers that are manufactured from polymer resins that have aromatic groups in their monomer subunits. Examples of suitable resins that have aromatic-containing monomer groups include cross-linked polystyrene, polypyridine, polyvinyl carbazole, and copolymers of these. It is believed that the aromatic-containing support materials are advantageous, in comparison to other support materials (e.g., silica), because of the relatively higher number of bonding sites where the metal-scavenging functional groups can be attached and/or because of the ease with which the metal-scavenging functional groups can be attached to these sites. The increased number of metal-scavenging functional groups per unit area of support material has been found to increase the overall efficiency of the scavenger. The use of aromatic-containing polymers is particularly advantageous in combination with acid treating the support material with sulfuric or nitric acid.

These and other advantages and features of the present invention will become more fully apparent from the following description and appended claims as set forth hereinafter.

DETAILED DESCRIPTION OF EXEMPLARY EMBODIMENTS

I. Introduction

The present invention is directed to methods for removing metal contaminants from polymers using novel solid scavengers. The solid scavengers are economical to manufacture and show improved efficiencies for removing metal contaminates as compared to scavengers used in known polymer purification processes.

II. Solid Scavengers

The solid scavengers are solid particles that have metal scavenging functional groups bonded to the surface of the particles. The solid scavengers are manufactured to have a greater number of metal scavenging functional groups compared to, for example, silica functionalized with silanes. Greater functionalization is achieved by treating the support material with sulfuric acid or nitric acid prior to functionalizing the particles with the metal-scavenging functional groups. The acid functionalization increases the number of sites where the metal-scavenging functional groups can be attached.

A. Methods For Manufacturing Solid Scavenger

In an exemplary embodiment, the solid scavengers are manufactured by (i) selecting an appropriate support material, (ii) treating the support material with sulfuric or nitric acid, and (iii) bonding an organic agent to the acid treated support or forming a metal-scavenging functional group on the acid treated support.

1. Providing A Solid Support Materials

The solid support can be any particulate that has a size and/or composition that facilitates separation between it and the solvent-polymer mixture used to purify the conductive polymers. The support material can be a solid inorganic material (e.g., silica) or a solid organic material (e.g., cross-linked polystyrene). The support particles include reactive sites on the surface of the particle where the particles can be functionalized (e.g., hydroxyl groups or benzene rings).

If an organic polymer is utilized, the organic polymer is selected in combination with the solvent used in the polymer purification procedure, described below, to ensure that the scavenger support is not soluble in the purification solvent. Examples of suitable solid organic materials include polystyrene, polypyridine, polyvinyl carbazole, and copolymers of these (e.g., poly(pyridine-styrene)).

In a preferred embodiment, the solid organic material is a polymer with aromatic-containing monomers. The organic polymers can be homopolymers or copolymers and the aromatic group can be included in one or more of the co-monomers. Organic polymers containing aromatic monomers have been found to be particularly advantageous in the methods of the present invention.

Inorganic materials can also be used to make the scavengers of the present invention. Examples of suitable solid inorganic support materials include, but are not limited to, alumina, silica, silica gel, titania, zirconia, magnesia, as well as the oxides of various other metals, alone or in combination.

The support material is typically a particulate with a suitable size for filtration. The particle size is selected to be small enough to facilitate mixing with the conductive polymers being purified, but large enough to be removed using filtration or another suitable separation technique. In an exemplary embodiment, the support particles have a diameter of about 1 micron to about 5 mm and a surface area of about 100 $m^2$/g to about 1000 $m^2$/g, although support materials having other particle sizes and surface areas can also be used.

2. Acid Functionalization

Following selection of the support material, the support is treated with sulfuric acid and/or nitric acid. The acid treatment step improves the functionalization of the support material and prepares the support material for additional functionalization with an organic agent. In an exemplary embodiment, the acid treatment step introduces sulfonate and/or nitro groups onto the surface of the support material. These functional groups can be used as bonding sites for the organic agent molecules or can be further modified.

The sulfuric acid or nitric acid can be provided in any form so long as the acid groups can react with the surface of the support. In a preferred embodiment, the sulfuric acid used to manufacture the solid scavenger is concentrated sulfuric acid or fuming sulfuric acid. The preferred form of nitric acid is concentrated nitric acid.

3. Metal-Scavenging Functionalization

The acid treated support material is functionalized to include metal-scavenging functional groups. In a preferred embodiment, the metal-scavenging functionalization is carried out through the addition of an organic functionalizing agent. The organic functionalizing agent includes individual molecules having two or more functional groups. A bonding functional group allows the functionalizing agent to be bonded to the acid treated support particles and a metal-scavenging functionalizing group gives the solid scavenger the desired scavenging functionality. The two or more functional groups (i.e., the bonding functional group and the metal-scavenging functional group) may be of the same type, or may be selected from two or more different types of functional groups.

The bonding functional group on the functionalizing agent is selected to react with sulfonate groups, nitro groups, and/or other surface functional groups on the support material (e.g., hydroxyl groups). Examples of suitable bonding interactions between the support material and the bonding functional groups include ionic, covalent, or hydrogen bonding. Examples of suitable bonding functional groups include, but are not limited to, hydroxyl (—OH), carboxamide group (—CONH$_2$), amino (—NH$_2$) and phosphine (—PH$_2$). The most preferred bonding group is amino.

The metal-scavenging functional groups are selected to bond with the metal impurities in the conductive polymer to be purified. In an exemplary embodiment, the metal-scavenging functional group can coordinate with a metal atom to form a complex. Preferably the metal-scavenging functional groups have little or no affinity to the polymer being purified or the solvent in which the polymer is dissolved. Selecting metal-scavenging functional groups with little or no affinity for the polymer and solvent facilitates the separation of the solid scavenger from the polymer mixture during the purification process.

Examples of suitable metal-scavenging functional groups include, but are not limited to, carboxyl, amine, thiol groups, hydroxyl, amide, a nitrile, nitrogen with a free lone pair of electrons (e.g., pyridine). Amino and thiol groups are preferred.

The organic functionalizing agent is typically a small organic molecule with two or more functional groups. Examples of suitable organic functionalizing agents include, but are not limited to, diamines such as ethylenediamine, amino-thiols such as cysteamine, and polyfunctional molecules such as tris(2-aminoethyl)amine. Examples of other suitable functionalizing agents include citric acid, oleic acid, glycolic acid, pheylenediamine, aminophenol, aminobenzoic acid, 2-mercapto benzyl alcohol, and the like. These exemplary functionalizing agents are referred to in their unbound form. Those skilled in the art will recognize that once the functionalizing agent is reacted with the support, the functionalizing agent molecules change slightly, (e.g., by losing a hydrogen or hydroxyl in a condensation reaction). As used herein, the foregoing functionalizing agents and molecules include these derivative compounds.

The reaction between the functionalizing agent and the acid treated support can be carried out by mixing the functionalizing agent and the acid treated support. The functionalizing agent bonds to at least a portion of the acid groups on the surface of the support. The functionalizing agent preferably bonds with the acid group, but reactions with other functional groups on the support can also occur and can be beneficial. The bonding can be ionic bonding, covalent bonding, or hydrogen bonding.

If needed, the reaction can be carried out in a solvent. Examples of suitable solvents include organic solvent, water, or a combination thereof. Organic solvents that can be used include alcohols, ethers, glycols, ketones, aldehydes, nitrites, and the like.

The metal-scavenging functionalization can be carried out in one or more reactions use one or more types of functionalizing agents. In one embodiment, a first organic agent is reacted with the acid functionalized support and then a second organic agent is reacted with the first organic agent. The multiple synthesis steps can be carried out using known synthesis techniques to provide any desired combination of metal-scavenging functionalization.

In an exemplary embodiment, the metal-scavenging functionalization is added to the acid treated support by reducing the acid group. For example, amine functionalization can be provided by reducing nitro groups to amine groups using a reducing agent such as hydrazine.

The solid scavengers manufactured according to the present invention can have improved functionalization compared to scavengers currently used for conductive polymer purification. In addition, the reagents and reactions used to manufacture the solid scavengers are very cost effective.

III. Methods for Purifying Polymers

The method for purifying polymers generally includes (i) forming a polymer mixture by dissolving the polymer in a solvent (ii) mixing the scavenger with the polymer mixture and allowing the solid scavenger to bond to metallic species in the polymer, (iii) separating the scavenger-metal complexes from the polymer mixture, and (iv) collecting the purified polymer from the polymer phase.

A. Polymer Mixture

The polymer mixture is formed by dissolving a polymer with metal contaminants into a selected solvent. The present invention is particularly suited for purifying conductive polymers. The conductive polymers can be any kind of conjugated polymers that are soluble in a selected solvent. Examples of suitable polymers include but are not limited to classes of polyphenyl, polyphenylvinyl, polyfluorene, polyaniline, polythiophene, polypyrrole, or any conjugated co-polymers.

Solvents suitable for use in the process of the present invention are capable of dissolving the polymer, but do not have strong interactions with the metallic species (i.e., contaminants) or the solid scavenger. In an exemplary embodiment, the solvent is aprotic and has low polarity. More preferably, the solvent is an aromatic solvent such as toluene, a haloalkane such as chloroform or dichloromethane, or a cyclic ether such as THF or dioxane. The preferred concentration of polymer solution is 0.2 percent to 10 percent, more preferably 0.5 percent to 2 percent.

B. Adding and Mixing the Solid Scavenger

A solid scavenger as described above is added to the polymer mixture. The solid scavenger is then mixed with the polymer to allow the solid scavenger to bond with the metallic species in the polymer.

The selection of the solid scavenger will depend on the particular polymer being used. Typically a solid scavenger is selected that has low affinity for the polymer and a high affinity for the metallic species. While these to features are of primary importance in selecting a suitable scavenger, other factors can also affect the purification process. These factors include the nature of the solvent, mixing temperature, concentrations, and pH.

The amount of scavenger used typically depends on the metallic content in polymer and the reactivity of the scavenger with the metals to be removed. In an exemplary embodiment, the concentration of the scavenger is 1-20 molecular equivalent of scavenger functional groups to metal atoms.

Thoroughly mixing of the solid scavenger enhances the efficiency of removal of the metallic impurities. Examples of suitable mixing techniques include ultrasonic mixing, mechanical shaking, magnetic stirring, and manual shaking in a separation funnel. The solid scavenger is typically mixed for greater than 1 hr, although mixing times less than an hour can be suitable for some purification purposes. More preferably the mixing time is greater than about 1.5 hours, more preferably greater than about 3 hours and most preferably greater than about 5 hours. Surprisingly, significant improvements in polymer purification can be achieved for these longer mixing times.

Optionally the polymer solution can be heated during the mixing step to accelerate the reaction between the metallic species and the scavenger agent. The upper limit of temperature at which mixing can be carried out is typically the boiling point of the solvent being used.

C. Scavenger and Polymer Separation

Once the scavenger has bonded to the metal impurities in the polymer, the solid scavenger and metal complexes are separated. In an exemplary embodiment, separation is carried out using filtration. Filtration can be carried with conventional filtration funnels with either glass fiber or filter paper. In an exemplary embodiment, filtration is carried out in a glass frit Buchner funnel. The pore size of the filter can be selected according to the solvent type, particle size of the solid scavenger, and filtration speed. The preferred porosity is 5 to 200 micrometer, and more preferable 10-100 micrometer. Optionally vacuum suction, centrifugation, and/or heating can be applied to accelerate the filtration.

D. Polymer Recovery

Once the solid scavenger has been separated, the conductive polymer is collected from the polymer mixture. The polymer is typically first concentrated by evaporating a portion of the solvent using vacuum distillation or a rotary evaporator. The polymer is then precipitated by addition of a poor solvent. The suitability of a solvent for precipitation depends on the particular polymer being precipitated. Examples of suitable solvents for various conductive polymers include methanol, ethanol, hexane, and acetone.

The precipitated polymer is collected through filtration and may be further washed with a solvent that has limited solubility to the polymer. The washing step can help to remove some organic impurities and to reduce polymeric molecular weight dispersion. The washed polymer is finally dried in a vacuum oven to obtain the final purified polymer.

Conductive polymers purified according to the methods of the present invention can be used in many different electro-optical components and devices, including diodes, light emitting diodes, photovoltaic devices, sensors, transistors, and memory storage devices.

IV. EXAMPLES

The following examples provide exemplary formulas for manufacturing catalyst precursors according to the present invention. Examples 1-4 provide formulas for making conductive polymers that can be used in the purification process of the present invention. Examples 5-8 illustrate formulas for purifying the conductive polymers manufactured in Examples 1-4.

Example 1

Polymer Preparation

Example 1 describes a method for manufacturing Poly[2,7-(9,9-dioctylfluorene)] ("PF") using a homogenous catalyst. The reaction is as follows:

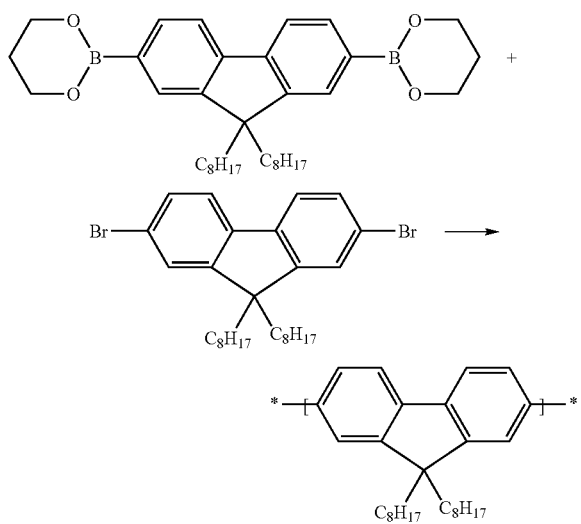

Carefully purified 2,7-dibromo-9,9-dioctylfluorene (1 equiv), 9,9-dioctylfluorene-2,7-bis-(trimethyleneborate) (1 equiv), and (PPh$_3$)$_4$Pd(0) (0.5-1.5 mol %) were dissolved in a mixture of toluene and aqueous 2 M Na$_2$CO$_3$ (1:1.5 toluene). The solution was first put under a nitrogen atmosphere and was fluxed with vigorous stirring for 48 hour. The whole mixture was then poured into methanol. The precipitated material was recovered by filtration through a Buchner funnel and washed with dilute HCl. The solid material was dried in a vacuum oven at 70° C. overnight. Gel permeation chromatography (GPC) revealed the molecular weight of this polymer against a polystyrene standard to be about 31,700 and a molecular number of 12,000.

ICP test showed 913 ppm Pd residue in the polymer. The polymer was further purified using Soxhlet extraction with acetone for 24 hour. After Soxhlet extraction, the Pd content was 226 ppm.

Example 2

Polymer Preparation

Example 2 describes a method for manufacturing poly[2,7-(9,9-dioctylfluorene)-co-N-(4-(3-methylpropyl)-diphenylaniline] ("PFN") using a hydrosoluble catalyst. The reaction is as follows:

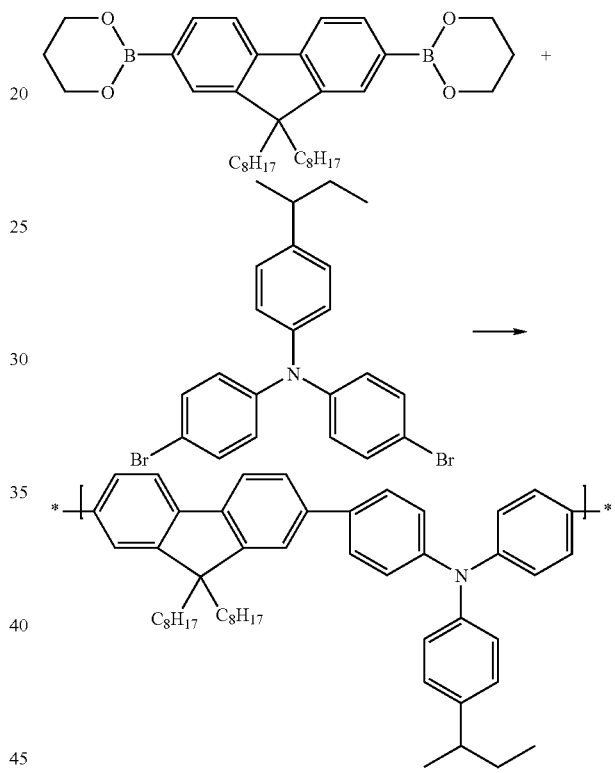

To manufacture PFN, a flask was purged with argon for 30 minutes. In this flask, 9,9-dioctylfluorene-2,7-bis-(trimethyleneborate) (1.18 g, 2.075 mmol), 4-(3-methylpropyl)-N,N-bis(4-bromophenyl)aniline (0.952 g, 2.075 mmol), and sodium diphenylphosphinobenzene-m-sulphonate (TPPMS, 0.018 g, 48 μmol) were dissolved in a mixture of THF and aqueous 2M Na$_2$CO$_3$ (42.5/20 ml). The solution was stirred under argon for 30 minutes. Then palladium acetate (0.0018 g, 8 μmol) was added quickly. The mixture was kept at 63° C. with vigorous stirring for 24 h (some precipitation of polymer was observed). The aqueous phase was then allowed to separate from the organic layer. The organic layer together with the solid precipitate was poured into a pre-prepared solvent mixture containing hydrochloric acid (2.0%) and methanol and stirred for another 24 h. The precipitated material was recovered by filtration and washed with methanol several times then dried in an oven under vacuum.

Gel permeation chromatography (GPC) revealed the molecular weight of this polymer against a polystyrene standard to be about 230,000 by weight and 160,000 by number. ICP testing showed 242 ppm Pd residue in the polymer.

Example 3

Polymer Preparation

Example 3 describes a method for manufacturing poly(9,9-dioctylfluorene-3,4-thiophene) ("PFS"). PFS was prepared using a similar procedure as in Example 2 except that the monomers were selected to carry out the following reaction:

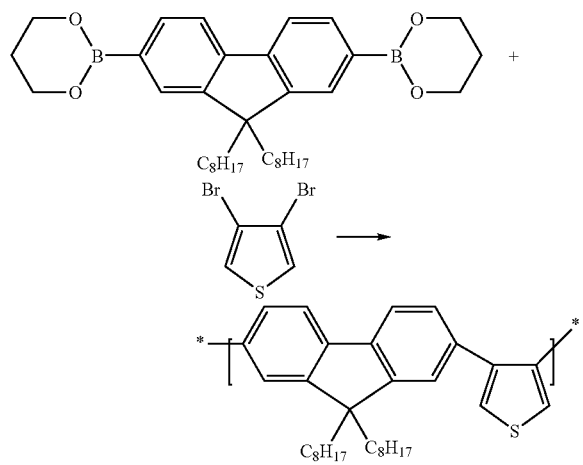

The GPC analysis indicated the polymer had a molecular weight of 102,900 and a molecular number of 77,300. ICP testing showed 167 ppm Pd in the polymer.

Example 4

Polymerization

Example 4 describes a method for manufacturing poly(9,9-dioctylfluorene-co-benzothiadiazole) (PFNS). PFNS was prepared using a similar procedure as in Example 2 except that the monomers were selected to carry out the following reaction:

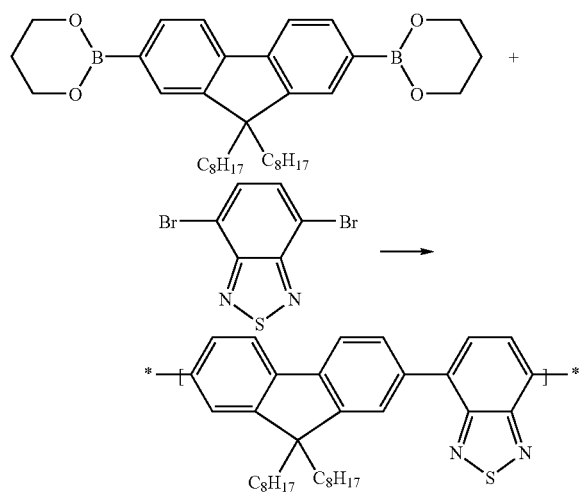

GPC analysis indicated that the polymer had a molecular weight of 82,600 and a molecular number of 54,900. ICP testing showed 154 ppm Pd in the polymer.

Example 5

Preparation of Scavenger

Example 5 describes a method for manufacturing a sulfonated solid scavenger according to the present invention. The solid scavenger includes a monofunctional amine. To prepare the solid scavenger of Example 5, 15 g of 2% cross-linked polystyrene was gradually added to 50 g of 15-20% fuming sulfuric acid at room temperature with stirring. Thereafter the temperature was slowly raised to 70° C. and held at that temperature for 1 hour. During the sulfonation reaction the solid support material became brownish. The suspension was then poured into an ice-water mixture. The brownish solid was filtered out and washed with water till the pH value of aqueous washing was between about 5 and 6. The sulfonated solid support material was then dried.

10 g of the sulfonated solid support was added to a solution of 8 ml of ethylenediamine in 100 ml ethanol. The suspension was shaken overnight. The solid material was filtered out and washed by ethyl alcohol and acetone to remove excess ethylenediamine. After the solid was dried in vacuum oven at 70° C. for 5 hour the solid was ready to be used as scavenger in polymer purification steps. Elemental analysis showed the scavenger had 13.03% N and 14.60% S.

Examples 6

Preparation of Scavenger

Example 6 describes the preparation of a solid scavenger on a silica support material. Example 6 was carried out using the same method as in Example 5 except that silica was used instead of cross-linked polystyrene. Elemental analysis showed the scavenger had 1.91% N.

Examples 7

Preparation of Scavenger

In Examples 7 a solid scavenger was prepared using the same procedure as Example 5, except that for example 7, cysteamine was substituted for ethylenediamine. Elemental analysis showed the scavenger had 7.17% N and 29.66% S.

Examples 8

Preparation of Scavenger

In Examples 8 a solid scavenger was prepared using the same procedure as Example 5, except that for example 8 tris(2-aminoethyl)amine was substituted for ethylenediamine. Elemental analysis showed the scavenger had 14.35% N and 11.63% S.

Example 9

Preparation of Scavenger

Example 9 describes a method for manufacturing a solid scavenger using nitration. 10 g of 2% cross-linked polystyrene was gradually added to a mixture of 40 g 98% sulfuric acid with 10 g 60% nitric acid with stirring. The reaction mixture was slowly heated to 50° C. and kept for 3 hour. Thereafter, the mixture was poured into a water-ice mixture. The solid was filtered out and washed with water until the pH value of aqueous washing was about 5 and 6. The nitrated solid support material was then dried.

Nitro groups on the polystyrene surface were reduced to amine groups by hydrazine solution. 10 g nitrated polystyrene was added to a solution of 40 ml hydrazine hydrate (80% water solution). The reaction mixture was stirred at room temperature for 8 hours. Then, the solid was filtered out and washed with water several times. The solid was dried in a vacuum oven at 70° C. overnight. Elemental analysis of the solid scavenger of Example 9 showed a nitrogen loading of 12.13 wt %.

Example 10

Polymer Purification

Examples 10 describe a method for purifying polymers using a solid scavenger according to the present invention. Each of the solid scavengers of Examples 5-9 were tested in one or more of the polymers of Examples 1-4. The polymer purification was carried out in a 250 ml flask, in which 1.8 g of polymer was dissolved in 150 ml of THF. To this solution was added 5 g of prepared scavenger. This resulting mixture was vigorously stirred for 24 h at 70° C. before solid removal by filtration. The filtrate was collected in a 250 ml evaporation flask and then concentrated to about 20 ml. The concentrated THF solution was then added, drop by drop through pipette, into a flask containing 500 ml of methanol under stirring. The resulting light yellow precipitate was filtered, washed with methanol, and dried under vacuum.

Table 1 lists palladium contents of the polymers of Examples 1-4 before purification with scavengers and after purification using the scavengers of Examples 5-9 (experiments not performed are indicated by --). Palladium content lower than 5 ppm was determined by ICP-MS.

TABLE 1 showing palladium concentration (ppm)

|  | Example 1 (PF) | Example 2 (PFN) | Example 3 (PFS) | Example 4 (PFNS) |
| --- | --- | --- | --- | --- |
| Unpurified | 226 | 242 | 167 | 154 |
| Example 5 (Si—N2) | 23 | 37 | 26 | 41 |
| Example 6 (PS—N2) | 0.92 | 0.56 | 2.3 | 1.8 |
| Example 7 (PS—NS) | 0.88 | 1.7 | — | 3.2 |
| Example 8 (PS—N4) | 1.3 | — | — | 1.1 |
| Example 9 (PS—N2) | 17 | 24 | 13 | — |

The purification method of example 10 illustrates the superior purification that can be achieved using the solid scavengers of the present invention as compared to known scavengers. The concentration of palladium using the scavengers of the present invention was reduced from hundreds of ppm to varied levels of less than tens of ppm. Surprisingly, the use of sulfonation with polystyrene produced extremely good results of less than 1 ppm. The purity of the polymers using the methods of the present invention improves the performance of the polymers in semiconductor and photodiode applications, among others.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for purifying a polymer, comprising:
preparing a solid scavenger comprising a plurality of metal-scavenging functional groups by first treating a particulate support material with sulfuric acid or nitric acid or a combination thereof followed by attaching or forming the metal-scavenging functional groups on the particulate support material, the particulate support material comprising an organic polymer having aromatic-containing monomers;
dissolving a polymer in an aprotic organic solvent to form a polymer mixture;
mixing the solid scavenger with the polymer mixture and allowing metal atoms in the polymer mixture to bond with the solid scavenger, and
separating the solid scavenger from the polymer mixture.

2. A method as in claim 1, in which the plurality of metal-scavenging functional groups comprises functional groups selected from the group consisting of a carboxyl, amine, thiol, hydroxyl, amide, nitrile, nitrogen with a free lone pair of electrons, and combinations thereof.

3. A method as in claim 1, in which the plurality of metal-scavenging functional groups are provided by reacting the acid treated support material with an organic functionalizing agent comprising the metal-scavenging functional groups.

4. A method as in claim 3, in which the organic functionalizing agent is selected from the group consisting of ethylenediamine, cysteamine, tris(2-aminoethyl)amine, citric acid, oleic acid, glycolic acid, pheylenediamine, aminophenol, aminobenzoic acid, 2-mercapto benzyl alcohol, and combinations thereof.

5. A method as in claim 1, in which the support material is treated with concentrated sulfuric acid, fuming sulfuric acid, or concentrated nitric acid.

6. A method as in claim 1, in which forming the solid scavenger comprises reacting the acid treated support material with an organic functionalizing agent.

7. A method as in claim 1, in which forming the solid scavenger comprises treating the support material with sulfuric acid and nitric acid and reducing nitro groups to form amine groups.

8. A method as in claim 1, in which the polymer is a conductive polymer.

9. A method as in claim 1, in which mixing the solid scavenger is carried out for greater than about 1.5 hours.

10. A method as in claim 1, in which mixing the solid scavenger is carried out for greater than about 3 hours.

11. A method for purifying a polymer, comprising:
dissolving a polymer in an aprotic organic solvent to form a polymer mixture;
providing a solid scavenger comprised of a plurality of particles, the particles comprising an inorganic oxide, each particle comprising a plurality of metal-scavenging functional groups bonded to the surface of the particle through a sulfonate group;
mixing the solid scavenger with the polymer mixture and allowing metal atoms in the polymer mixture to bond therewith, and
separating the solid scavenger from the polymer mixture.

12. A method as in claim 11, in which the inorganic oxide is selected from the group consisting of alumina, silica, silica gel, titania, zirconia, magnesia, metal oxides, and combinations thereof.

13. A method as in claim 11, in which the plurality of metal-scavenging functional groups comprises functional groups selected from the group consisting of carboxyl, amine, thiol, hydroxyl, amide, nitrile, nitrogen with a free lone pair of electrons, and combinations thereof.

14. A method as in claim 11, in which the polymer is an electrically conducting polymer.

15. A method for purifying a polymer, comprising:
dissolving a conductive polymer in an aprotic organic solvent to form a polymer mixture;
providing a solid scavenger comprised of a plurality of polymeric particles, each particle being treated with at least one of sulfuric acid or nitric acid and comprising at least one member selected from the group consisting of polystyrene, polypyridine, polyvinyl carbazole, and combinations thereof, each particle further comprising a plurality of metal-scavenging functional groups bonded to the surface of the polymeric particles;
mixing the solid scavenger with the polymer mixture and allowing metal atoms in the polymer mixture to bond with the solid scavenger; and
separating the solid scavenger from the polymer mixture.

16. A method as in claim 15, in which the plurality of metal-scavenging functional groups comprises functional groups selected from the group consisting of a carboxyl, an amine, a thiol and combinations thereof.

\* \* \* \* \*

UNITED STATES PATENT AND TRADEMARK OFFICE
CERTIFICATE OF CORRECTION

| | |
|---|---|
| PATENT NO. | : 7,687,601 B2 |
| APPLICATION NO. | : 11/538339 |
| DATED | : March 30, 2010 |
| INVENTOR(S) | : Liu et al. |

It is certified that error appears in the above-identified patent and that said Letters Patent is hereby corrected as shown below:

Column 6
Line 15, change "to" to --two--

Signed and Sealed this

Fourteenth Day of September, 2010

David J. Kappos
*Director of the United States Patent and Trademark Office*